ation of | application | No.
PCT/CN2021/107891, filed on Jul. 22, 2021.

(12) United States Patent
Yu

(10) Patent No.: US 12,096,620 B2
(45) Date of Patent: Sep. 17, 2024

(54) METHOD FOR MANUFACTURING MEMORY AND MEMORY

(71) Applicant: CHANGXIN MEMORY TECHNOLOGIES, INC., Hefei (CN)

(72) Inventor: Yexiao Yu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 398 days.

(21) Appl. No.: 17/451,645

(22) Filed: Oct. 20, 2021

(65) Prior Publication Data

US 2022/0328495 A1 Oct. 13, 2022

Related U.S. Application Data

(63) Continuation of application No. PCT/CN2021/107891, filed on Jul. 22, 2021.

(30) Foreign Application Priority Data

Apr. 7, 2021 (CN) .......................... 202110371860.6

(51) Int. Cl.
| H01L 27/108 | (2006.01) |
| G11C 5/06 | (2006.01) |
| H01L 21/768 | (2006.01) |
| H01L 23/528 | (2006.01) |
| H01L 23/532 | (2006.01) |
| H10B 12/00 | (2023.01) |

(52) U.S. Cl.
CPC .......... *H10B 12/488* (2023.02); *G11C 5/063* (2013.01); *H01L 21/76816* (2013.01); *H01L 21/76843* (2013.01); *H01L 21/76862* (2013.01); *H01L 23/5283* (2013.01); *H01L 23/53266* (2013.01); *H10B 12/50* (2023.02)

(58) Field of Classification Search
CPC ...... H10B 12/488; H10B 12/50; G11C 5/063; H01L 21/76816; H01L 21/76843; H01L 21/76862; H01L 23/5283; H01L 23/53266
See application file for complete search history.

(56) References Cited

U.S. PATENT DOCUMENTS

| 2003/0013254 | A1* | 1/2003 | Tsuji | ...................... | H10B 41/30 |
| | | | | | 438/257 |
| 2007/0218684 | A1* | 9/2007 | Kim | .................. | H10B 12/0335 |
| | | | | | 257/E21.585 |
| 2022/0122984 | A1* | 4/2022 | Tung | ...................... | H10B 12/09 |

FOREIGN PATENT DOCUMENTS

| CN | 108630706 A | 10/2018 |
| CN | 108831891 A | 11/2018 |

(Continued)

*Primary Examiner* — Ictor A Mandala
*Assistant Examiner* — Colleen E Snow
(74) *Attorney, Agent, or Firm* — Syncoda LLC; Feng Ma

(57) ABSTRACT

A method for manufacturing a memory includes: providing a substrate having a core region provided with a word line; forming a dielectric layer on the substrate, and etching the dielectric layer to form a first filling hole exposing the word line; forming a barrier layer on a hole wall of the first filling hole, where the barrier layer located in the first filling hole surrounds and forms a first intermediate hole exposing the word line; etching the word line exposed in the first intermediate hole to remove a first residue on the word line; and forming in the first intermediate hole a first wire electrically connected to the word line.

15 Claims, 13 Drawing Sheets

(56) References Cited

FOREIGN PATENT DOCUMENTS

| | | |
|---|---|---|
| CN | 109994478 A | 7/2019 |
| CN | 111566786 A | 8/2020 |

* cited by examiner

METHOD FOR MANUFACTURING MEMORY AND MEMORY

CROSS-REFERENCE TO RELATED APPLICATIONS

This is a continuation of International Patent Application No. PCT/CN2021/107891 filed on Jul. 22, 2021, which claims priority to Chinese Patent Application No. 202110371860.6 filed on Apr. 7, 2021. The disclosures of these applications are incorporated by reference herein in their entirety.

BACKGROUND

With the gradual development of storage device technologies, Dynamic Random-Access Memory (DRAM) is gradually applied to various electronic devices due to its higher density and faster read and write speed. A DRAM generally includes a substrate and a dielectric layer provided on the substrate. The substrate includes a core region and a peripheral region. A word line is provided in the core region. A first wire electrically connected to the word line in the core region and a second wire connected to the substrate in the peripheral region are provided in the dielectric layer.

SUMMARY

The present disclosure relates to the technical field of storage device, and in particular, to a method for manufacturing a memory and a memory.

According to a first aspect of the present disclosure, there is provided a method for manufacturing a memory, including: providing a substrate having a core region provided with a word line; forming a dielectric layer on the substrate, and etching the dielectric layer to form a first filling hole exposing the word line; forming a barrier layer on a hole wall of the first filling hole, where the barrier layer located in the first filling hole surrounds and forms a first intermediate hole exposing the word line; etching the word line exposed in the first intermediate hole to remove a first residue on the word line; and forming in the first intermediate hole a first wire electrically connected to the word line.

According to a second aspect of the present disclosure, there is provided a memory, including: a substrate, a dielectric layer, a barrier layer and a first wire. The substrate includes a core region and a peripheral region. A word line is formed in the core region. The dielectric layer is provided on the substrate, and is provided with a first filling hole and a second filling hole that run through the dielectric layer. The first filling hole is located in the core region and extends to the word line, and the second filling hole is located in the peripheral region and extends to the substrate. The barrier layer is provided on a hole wall of the first filling hole and a hole wall of the second filling hole. The barrier layer located in the first filling hole surrounds and forms a first intermediate hole exposing the word line, and the barrier layer located in the second filling hole surrounds and forms a second intermediate hole exposing the substrate. The first wire is filled in the first intermediate hole and is electrically connected to the word line. The second wire is filled in the second intermediate hole and is electrically connected to the substrate.

DETAILED DESCRIPTION

Typically, when forming the first wire and the second wire, it is necessary to first expose the core region and the word line, as well as the substrate in the peripheral region. The metal surface of the word line and the surface of the substrate are susceptible to oxidation to generate oxides in the exposure process. If these oxides are not cleaned completely, resistance values at electrical connections will increase, which directly affects the storage speed and storage efficiency.

Figure 1:
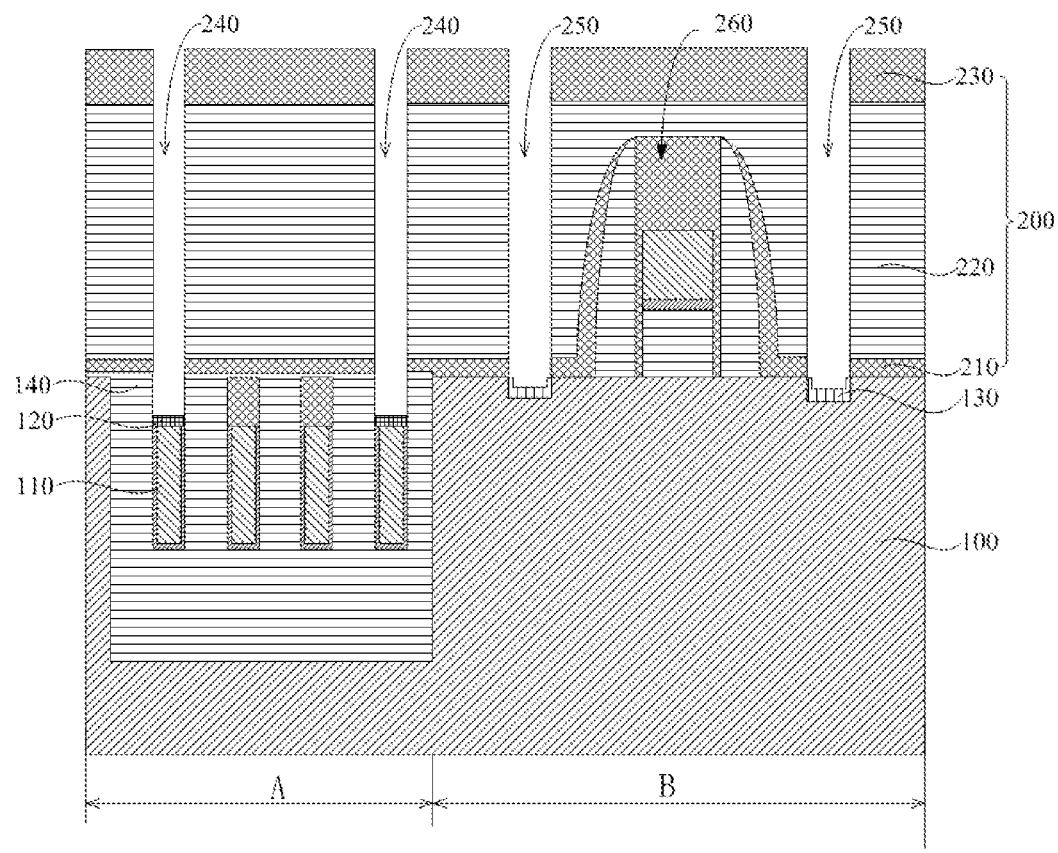
FIG. 1 is a schematic diagram of a first residue and a second residue in an implementation.

Referring to FIG. 1 to FIG. 4, in some implementations, when manufacturing a memory, a dielectric layer 200 is usually first formed on a substrate 100, and a first filling hole 240 and a second filling hole 250 are then formed in the dielectric layer 200. The first filling hole 240 extends to a word line 110 located in a core region of the substrate 100, and the second filling hole 250 extends to the substrate 100 located in a peripheral region. As shown in FIG. 1, the first filling hole 240 exposes the word line 110, and the second filling hole 250 exposes the substrate 100. A first residue 120 is easily formed on the exposed surface of the word line 110, and a second residue 130 is easily formed on the exposed surface of the substrate 100. Before forming a first wire 400 in the first filling hole 240 and forming a second wire 500 in the second filling hole 250, it is usually necessary to remove the first residue 120 and the second residue 130, so as to reduce resistance values between the first wire 400 and the word line 110 and between the second wire 500 and the substrate 100, thereby improving the storage efficiency and storage speed.

Figure 2:
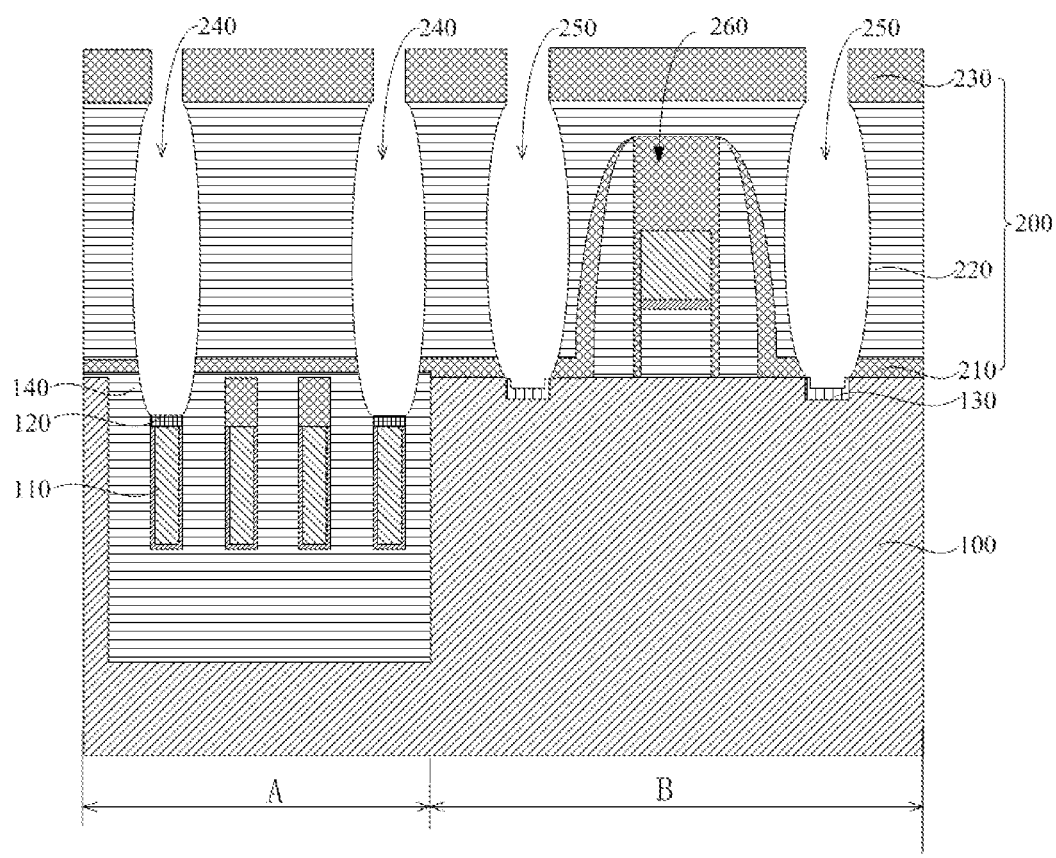
FIG. 2 is a schematic diagram after forming a first filling hole and a second filling hole in an implementation.
Figure 3:
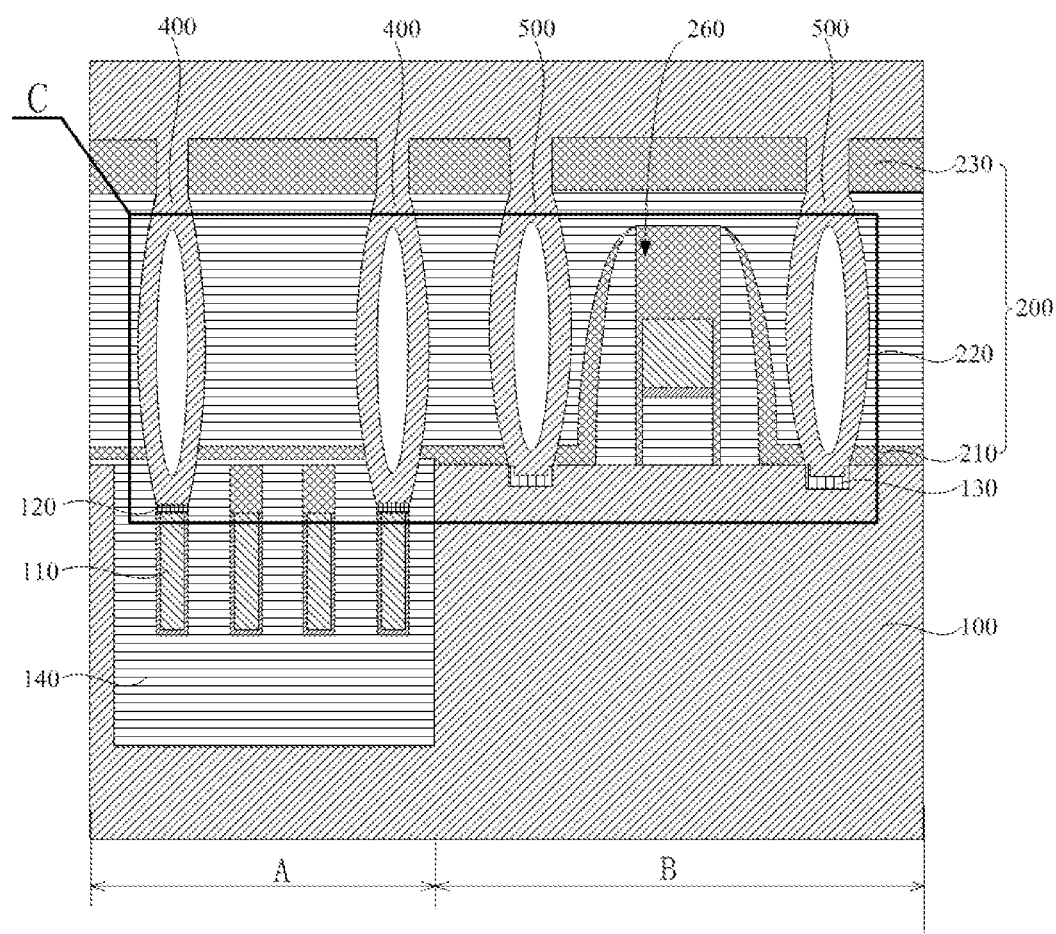
FIG. 3 is a schematic diagram after forming a first wire and a second wire in an implementation.
Figure 4:
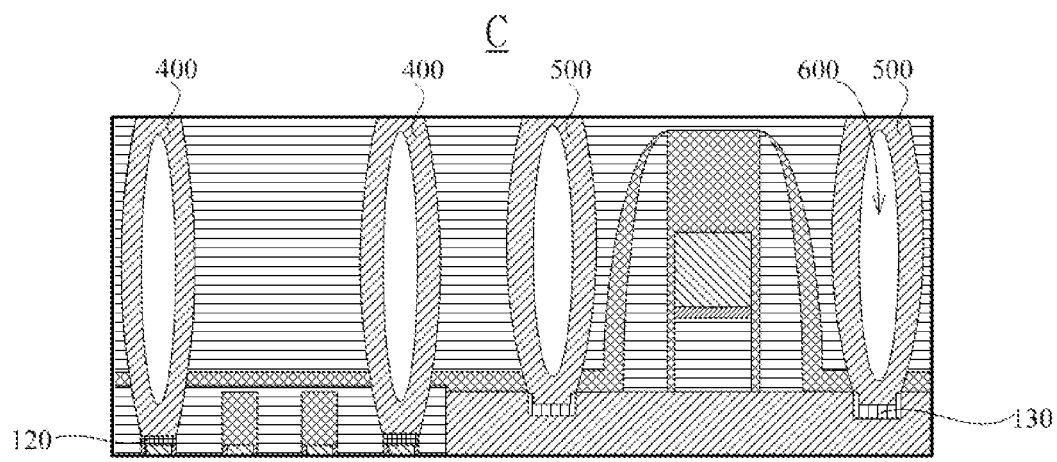
FIG. 4 is a partial enlarged view of a portion C in FIG. 3.

However, in a process of removing the first residue 120 and the second residue 130, the first residue 120 and the second residue 130 are not easy to be removed, thereby affecting the performance of the memory. In addition, a hole wall of the first filling hole 240 and a hole wall of the second filling hole 250 are prone to bending as shown in FIG. 2, so that voids 600 shown in FIG. 3 and FIG. 4 are subsequently formed inside the first wire 400 and the second wire 500, which will reduce the charge transfer capability of the first wire 400 and the second wire 500, resulting in lower storage efficiency and storage speed.

In order to improve the storage efficiency and storage speed of the memory, the embodiments of the present disclosure provide a method for manufacturing a memory. By forming on a hole wall of a first filling hole a barrier layer, which protects the hole wall of the first filling hole in a processor of removing a first residue, the first residue can be removed more adequately, thereby improving the performance of the memory. In addition, the barrier layer can also reduce or even prevent the bending of the hole wall of the first filling hole, so that fewer or no voids are subsequently formed inside the first wire, thereby improving the charge transfer capability of the first wire, and further improving the storage speed and storage efficiency of the memory.

In order to make the objectives, features, and advantages of the embodiments of the present disclosure more comprehensible, the following clearly and completely describes the technical solutions in the embodiments of the present disclosure with reference to the accompanying drawings in the embodiments of the present disclosure. Apparently, the described embodiments are merely some rather than all of the embodiments of the present disclosure. All other embodiments obtained by those of ordinary skill in the art based on the embodiments of the present disclosure without creative efforts shall fall within the scope of protection of the present disclosure.

Figure 5:
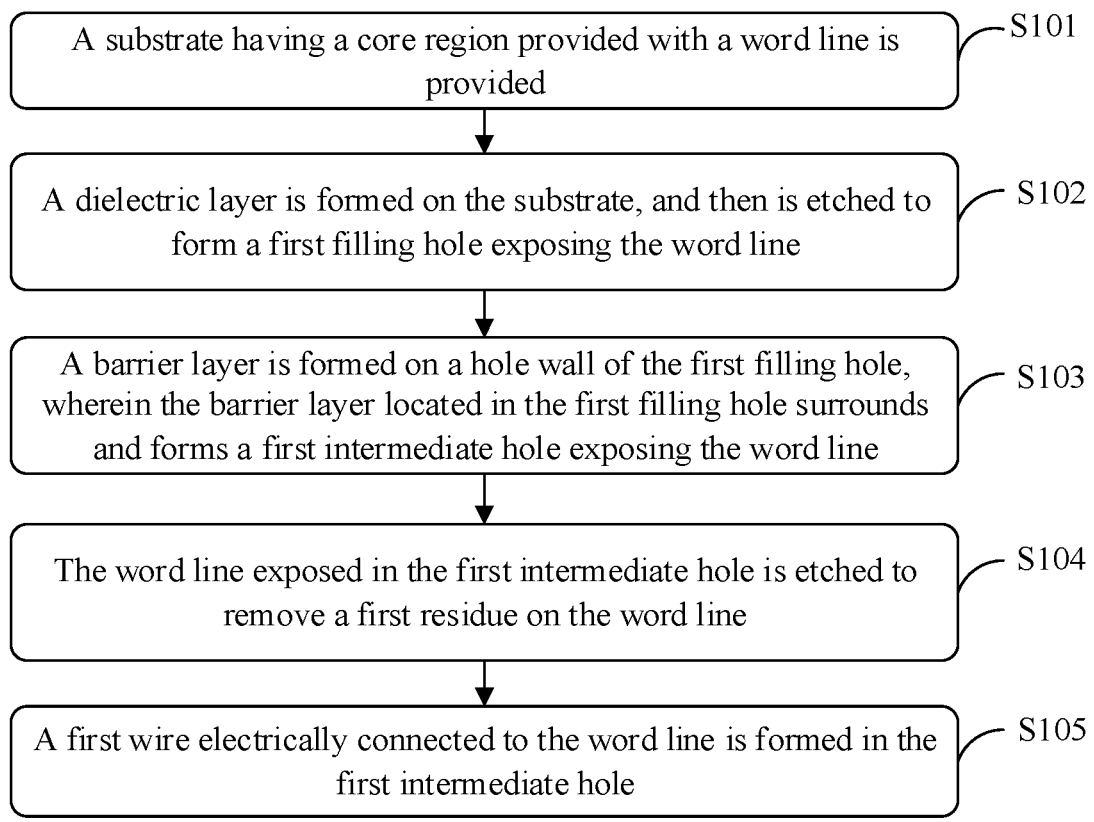
FIG. 5 is a flowchart of a method for manufacturing a memory according to an embodiment of the present disclosure.

Referring to FIG. 5, the embodiments of the present disclosure provide a method for manufacturing a memory. The manufacturing method includes the following steps.

At step S101, a substrate having a core region provided with a buried word line is provided.

The substrate 100 may be a semiconductor substrate, such as a silicon (Si) substrate. Certainly, the embodiments of the present disclosure are not limiting. Exemplarily, the substrate may also be a germanium (Ge) substrate, a Silicon on Insulator (SOI), a silicon germanium (SiGe) substrate, a silicon carbide (SiC) or a gallium nitride (GaN) substrate, etc.

Figure 6:
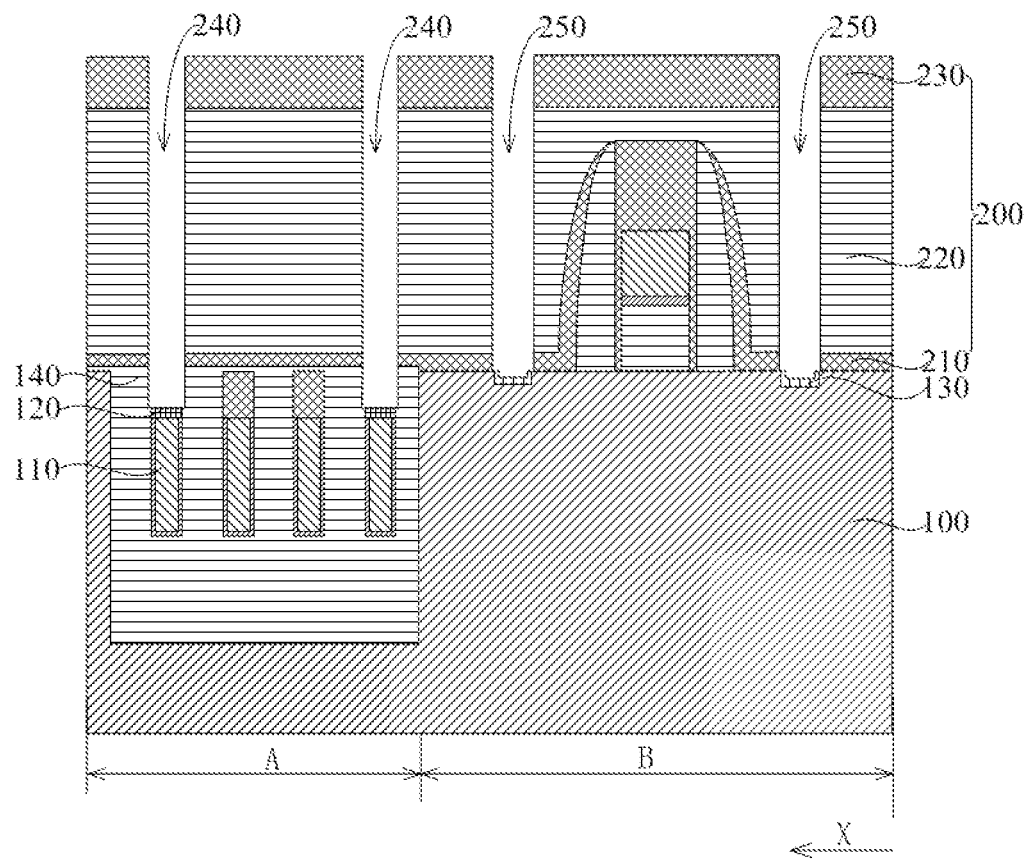
FIG. 6 is a schematic structural diagram after forming a first filling hole according to an embodiment of the present disclosure.

The substrate 100 includes a core region, and the core region is located at a portion A shown in FIG. 6. A word line 110 is provided in the core region, for example, the word line 110 is a buried word line. The word line 110 may include a first conductive layer and an anti-diffusion layer provided on a side wall and a bottom wall of the first conductive layer. Exemplarily, the material of the first conductive layer is tungsten, and the material of the anti-diffusion layer is titanium nitride.

There may be multiple word lines 110, and the multiple word lines 110 are arranged at intervals. For example, an isolation structure 140 is provided between the word lines 110 so as to electrically isolate the word lines 110. The isolation structure 140 may be filled with an insulating material such as silicon oxide ($SiO_2$).

In a possible example, as shown in FIG. 6, the substrate 100 includes a core region and a peripheral region. The core region abuts the peripheral region. The core region is located at the portion A shown in FIG. 6, and the peripheral region is located at a portion B shown in FIG. 6. A capacitor is subsequently formed above the core region of the substrate 100, and a peripheral circuit is subsequently formed above the peripheral region of the substrate 100, for example, a transistor 260 and the like are formed.

At step S102, a dielectric layer is formed on the substrate, and the dielectric layer is etched to form an exposed first filling hole.

With continued reference to FIG. 6, a dielectric layer 200 is formed on the substrate 100, the dielectric layer 200 is etched to form a first filling hole 240 running through this layer, and the first filling hole 240 extends to the word line 110 to expose the word line 110.

As shown in FIG. 6, a hole bottom of the first filling hole 240 is located in the substrate 100. That is, the upper hole wall of the first filling hole 240 is the dielectric layer 200, the lower hole wall of the first filling hole 240 is the substrate 100. Moreover, the word line 110 is exposed in the first filling hole 240 so as to subsequently form a first wire 400 electrically connected to the word line 110.

The dielectric layer 200 may be a laminated structure. As shown in FIG. 6, the dielectric layer 200 includes a first protective layer 210, an intermediate layer 220, and a second protective layer 230. The first protective layer 210 is provided on the substrate 100. The material of each of the first protective layer 210 and the second protective layer 230 includes silicon nitride ($Si_3N_4$), and the material of the intermediate layer 220 includes silicon oxide.

In a possible example, the first protective layer 210, the intermediate layer 220, and the second protective layer 230 are deposited on the substrate 100 in sequence. A part of the first protective layer 210, a part of the intermediate layer 220, and a part of the second protective layer 230 are removed by etching to form an etched hole. The etched hole exposes the substrate 100. The substrate 100 is etched along the etched hole to form an etched groove in the substrate 100. The etched groove exposes the word line 110. The etched hole and the etched groove form the first filling hole 240.

In a horizontal direction, a size of the first filling hole 240 is greater than a size of the word line 110, to facilitate the formation of the barrier layer 300 and the first wire 400. That is, taking a plane perpendicular to the word line 110 as a cross section, in the horizontal direction (X direction) as shown in FIG. 6, the cross-sectional width of the first filling hole 240 is greater than the cross-sectional width of the word line 110. Exemplarily, in the horizontal direction as shown in FIG. 6, a hole wall of the first filling hole 240 has a distance difference of 1-3 nm from an edge of the word line 110.

It is understandable that, after the first filling hole 240 is formed, an oxide may be formed on the exposed surface of the word line 110, and the oxide is the first residue 120 on the word line 110. The first residue 120 is exposed in the first filling hole 240, and needs to be removed subsequently so as to reduce the impact of the first residue 120 on the contact resistance between the word line 110 and the first wire 400.

At step S103, a barrier layer is formed on a hole wall of the first filling hole, in which the barrier layer located in the first filling hole surrounds and forms a first intermediate hole exposing the word line.

Figure 7:
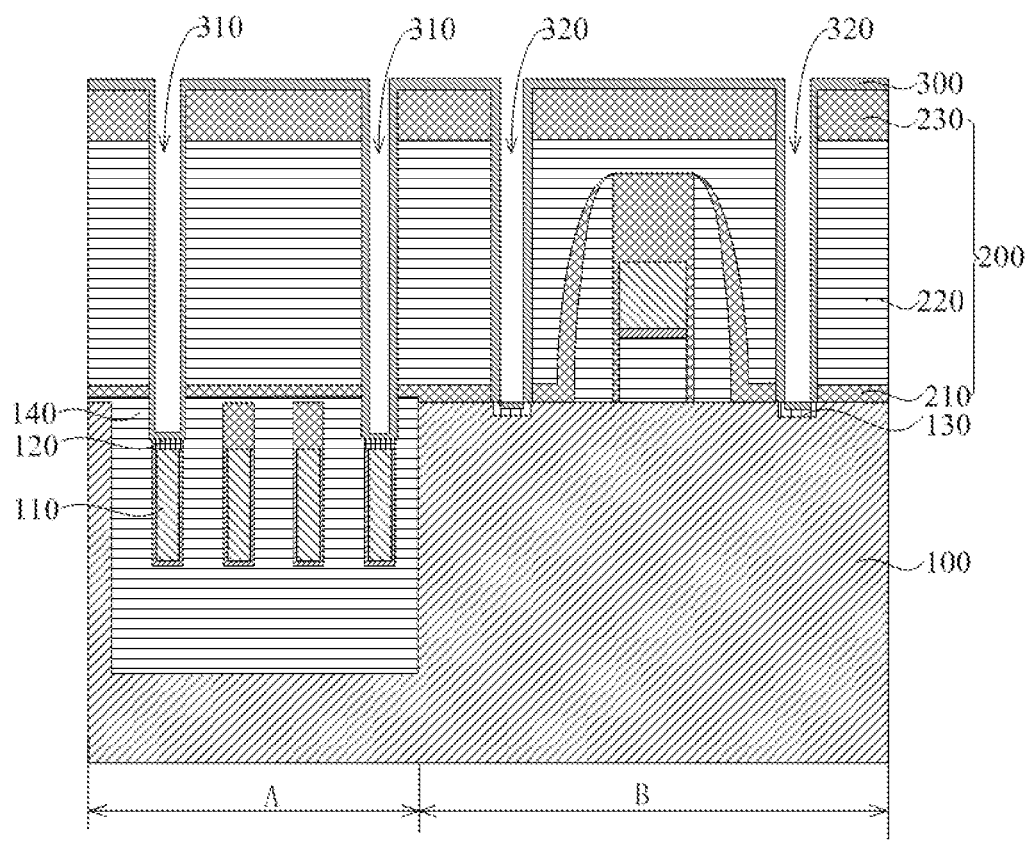
FIG. 7 is a schematic structural diagram after forming a barrier layer according to an embodiment of the present disclosure.
Figure 8:
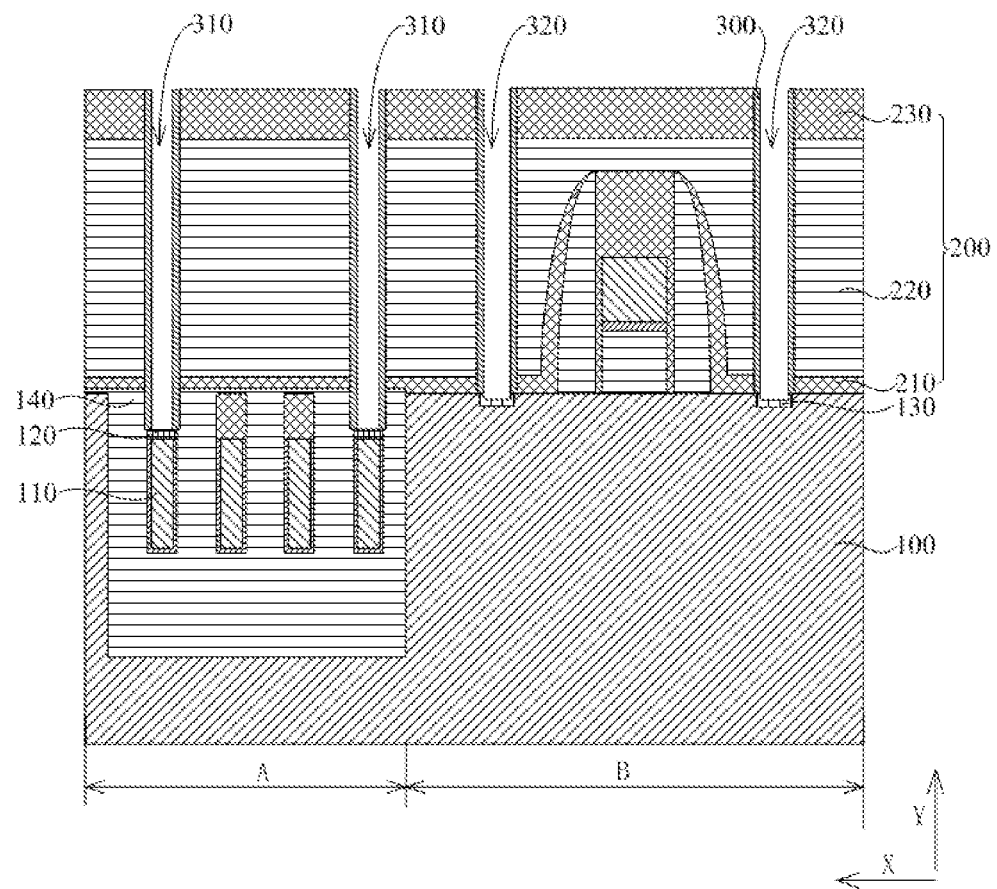
FIG. 8 is a schematic structural diagram after removing parts of the barrier layer according to an embodiment of the present disclosure.

Referring to FIG. 7 and FIG. 8, a barrier layer 300 is formed on a hole wall of the first filling hole 240, so as to protect the hole wall of the first filling hole 240 and prevent the hole wall of the first filling hole 240 from being damaged in subsequent etching. The barrier layer 300 located in the first filling hole 240 surrounds and forms a first intermediate hole 310, and the barrier layer 300 may be a titanium nitride (TiN) layer.

In a possible example, the operation that the barrier layer is formed on the hole wall of the first filling hole, where the barrier layer located in the first filling hole surrounds and forms a first intermediate hole exposing the word line includes the following steps.

The barrier layer is formed on the hole wall and a hole bottom of the first filling hole and the dielectric layer, where the barrier layer in located the first filling hole surrounds and forms the first intermediate hole.

As shown in FIG. 7, the barrier layer 300 is formed by deposition on the hole wall and hole bottom of the first filling hole 240 and the dielectric layer 200. Exemplarily, the barrier layer 300 is formed by means of an Atomic Layer Deposition (ALD) process to obtain the barrier layer 300 with better density. Certainly, the barrier layer 300 may also be formed by means of a Physical Vapor Deposition (PVD) process or a Chemical Vapor Deposition (CVD) process, or the like.

After the barrier layer is formed on the hole wall and hole bottom of the first filling hole and the dielectric layer, the barrier layer located on the dielectric layer and the hole bottom of the first intermediate hole is removed.

Referring to FIG. 8, by means of directional etching, the barrier layer 300 on the dielectric layer 200 and the hole bottom of the first intermediate hole 310 is removed to expose the dielectric layer 200 and the word line 110. It is understandable that a part of the barrier layer 300 is removed by etching in a vertical direction (Y direction) shown in FIG. 8, so as to reduce the etching in the horizontal direction (X direction) shown in FIG. 8. That is, lateral etching is reduced, and the barrier layer 300 on the hole wall of the first filling hole 240 is less etched. Exemplarily, by controlling the directionality of plasma, the barrier layer 300 is etched in a desired direction.

As shown in FIG. 8, after the barrier layer 300 located on the dielectric layer 200 and the hole bottom of the first intermediate hole 310 is removed, the word line 110 is exposed in the first intermediate hole 310. The exposed surface of the word line 110 has a first residue 120, that is, the first residue 120 on the word line 110 is also exposed in the first intermediate hole 310. The first residue 120 may be an oxide formed after the word line 110 is oxidized.

At step S104, the word line exposed in the first intermediate hole is etched to remove a first residue on the word line.

Figure 9:
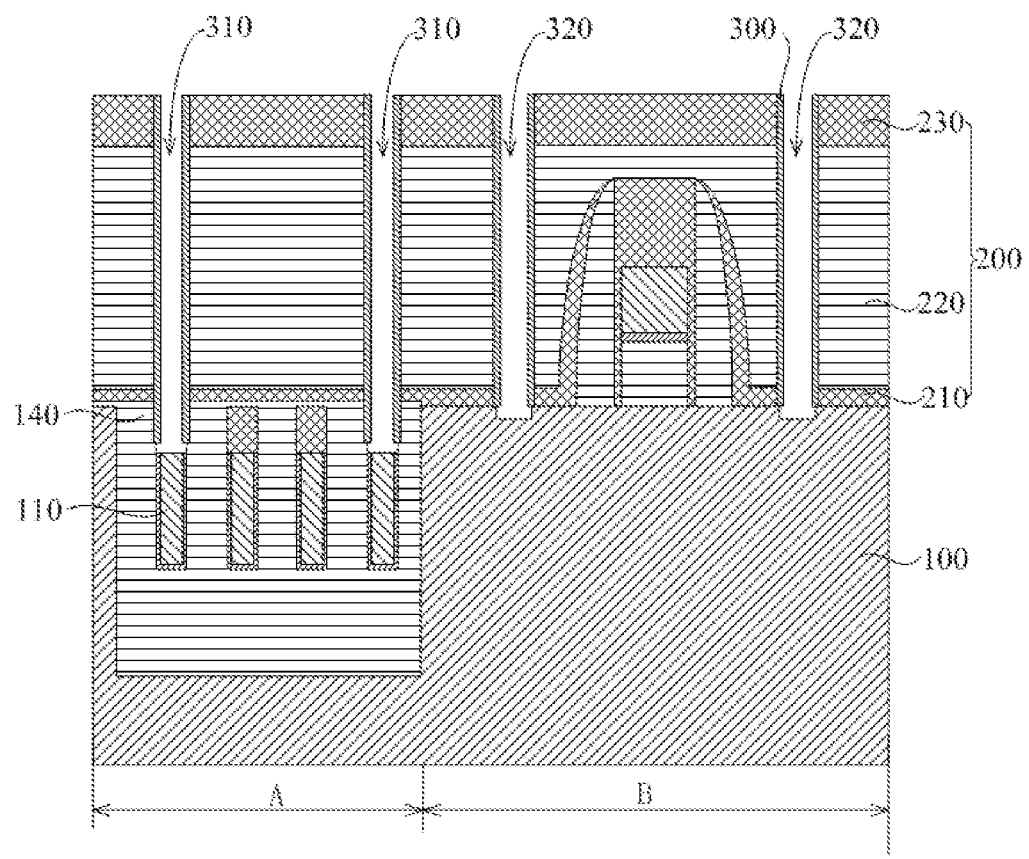
FIG. 9 is a schematic structural diagram after removing a first residue according to an embodiment of the present disclosure.

Referring to FIG. 9, the word line 110 and the first residue 120 on the word line 110 are exposed in the first intermediate hole 310, and the exposed word line 110 is etched to remove the first residue 120 on the word line 110. As shown in FIG. 9, at least a part of the first residue 120 on the surface of the word line 110 is removed, that is, a little or no first residue 120 is left.

In the embodiments of the present disclosure, the step of etching the word line exposed in the first intermediate hole to remove the first residue on the word line may include: removing the first residue on the word line by means of plasma etching to generate a first reactant; and then removing the first reactant by means of wet etching.

Exemplarily, the material of the word line 110 is tungsten (W), the first residue 120 is tungsten oxide ($WO_3$), the first reactant is tungsten, and a first etching gas used in the plasma etching is a mixture of hydrogen ($H_2$) and argon (Ar). The reaction formula for the plasma etching of the first residue 120 is:

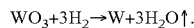

$WO_3 + 3H_2 \rightarrow W + 3H_2O\uparrow$.

When the first residue 120 is etched using the first etching gas, the first residue 120 undergoes a reduction reaction to generate tungsten, and then the generated tungsten is removed by means of wet etching, so that the first residue 120 on the word line 110 is removed to form a relatively smooth surface of the word line 110.

It is understandable that in the process of removing the first residue 120 on the word line 110, a fewer barrier layer 300 is removed, and thus the hole wall of the first filling hole 240 can be protected to allow the first residue 120 to be fully reacted. Therefore, the removal effect of the first residue 120 is improved, and a little or no first residue 120 is left. For example, there is a greater etch rate selectivity ratio of the first residue 120 to the barrier layer 300, so that in the process of etching the first residue 120, a fewer barrier layer 300 is etched.

At step S105, a first wire electrically connected to the word line is formed in the first intermediate hole.

Figure 10:
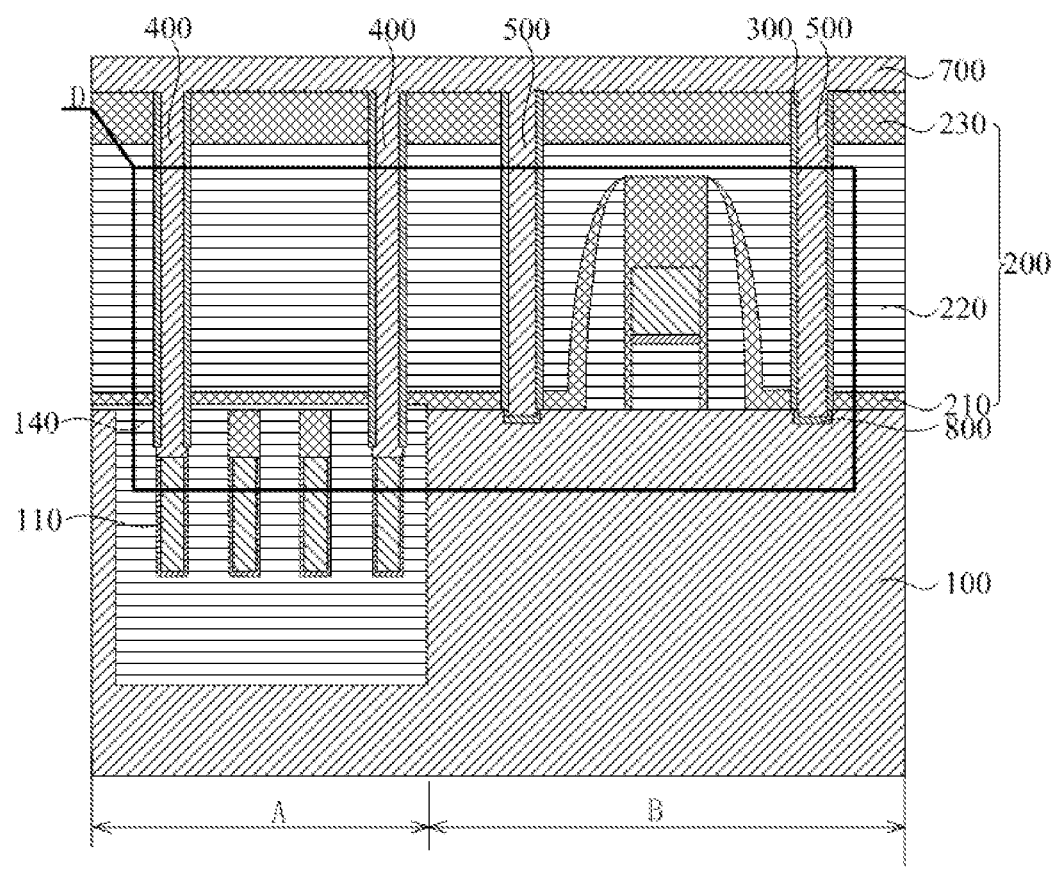
FIG. 10 is a schematic structural diagram after forming a first wire according to an embodiment of the present disclosure.
Figure 11:
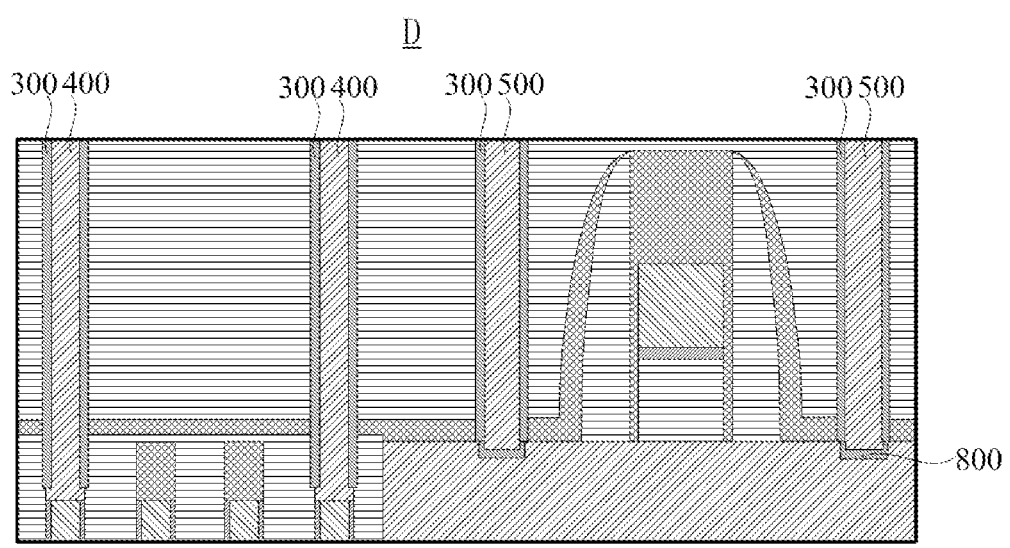
FIG. 11 is an enlarged view of a portion Din FIG. 10.

Referring to FIG. 10 and FIG. 11, the first wire 400 is filled in the first intermediate hole 310, and the first wire 400 is located above the word line 110 and is in contact with the word line 110, so that the first wire 400 is electrically connected to the word line 110. Exemplarily, a conductive material is deposited in the first intermediate hole 310 to form the first wire 400, and the material of the first wire 400 includes tungsten.

As shown in FIG. 10 and FIG. 11, there is little or no first residue 120 between the first wire 400 and the word line 110. The contact resistance between the first wire 400 and the word line 110 is small, the charge transfer between the first wire 400 and the word line 110 is better, and the storage speed and storage efficiency of the memory are higher. In addition, the barrier layer 300 is less etched, so that the hole wall of the first filling hole 240 is protected from being etched and the hole wall of the first filling hole 240 is relatively straight on the one hand, and the bowing degree of each of the first filling hole 240 and the first intermediate hole 310 is also reduced on the other hand. When the first intermediate hole 310 is filled with the first wire 400, voids are not easy to appear in the first wire 400, thereby reducing the resistance value of the first wire 400, improving the charge transfer capability of the first wire 400, and further improving the performance of the memory.

The method for manufacturing a memory provided in the embodiments of the present disclosure includes: providing a substrate 100 having a core region provided with a word line 110; forming a dielectric layer 200 on the substrate 100 and etching the dielectric layer 200 to form a first filling hole 240 exposing the word line 110; forming a barrier layer 300 on a hole wall of the first filling hole 240, in which the barrier layer 300 located in the first filling hole 240 surrounds and forms a first intermediate hole 310 exposing the word line 110; etching the word line 110 exposed in the first intermediate hole 310 to remove a first residue 120 on the word line 110; and forming in the first intermediate hole 310 a first wire 400 electrically connected to the word line 110. The barrier layer 300 is formed on the hole wall of the first filling hole 240, so that when the first residue 120 on the word line 110 is subsequently removed, the barrier layer 300 protects the hole wall of the first filling hole 240, the first residue 120 therefore can be fully removed and the content of the first residue 120 is reduced, thereby reducing the resistance between the first wire 400 and the word line 110, and improving the performance of the memory. In addition, the barrier layer 300 can also reduce or even prevent the bending of the hole wall of the first filling hole 240, so that fewer voids 600 are subsequently formed inside the first wire 400, thereby improving the charge transfer capability of the first wire 400, and further improving the storage speed and storage efficiency of the memory.

Referring again to FIG. 6 to FIG. 11, the substrate 100 in the embodiments of the present disclosure further includes a peripheral region. A second filling hole 250 is formed in the dielectric layer 200 located in the peripheral region. The second filling hole 250 extends to the substrate 100 to expose a part of the substrate 100.

As shown in FIG. 6, the dielectric layer 200 located above the core region is provided with a first filling hole 240, and the first filling hole 240 runs through the dielectric layer 200 and extends to the word line 110. The dielectric layer 200 located above the peripheral region is provided with a second filling hole 250, the second filling hole 250 runs through the dielectric layer 200, and the second filling hole 250 exposes the substrate 100.

The first filling hole 240 and the second filling hole 250 may be formed in the same etching process. Exemplarily, the dielectric layer 200 is deposited on the substrate 100. Parts of the dielectric layer 200 are removed by etching to form an etched hole located above the core region and the second filling hole 250 located above the peripheral region. The substrate 100 is exposed in the etched hole and the second filling hole 250. The substrate 100 is etched along the etched hole to form an etched groove. The word line 110 is exposed in the etched groove. The etched hole and the etched groove form the first filling hole 240.

It is understandable that, after the second filling hole 250 is formed, an oxide will be formed on the exposed surface of the substrate 100, and the oxide is the second residue 130 on the substrate 100. The second residue 130 is exposed in the second filling hole 250, and needs to be removed subsequently so as to reduce the impact of the second residue 130 on the resistance value between the substrate 100 and the second wire 500.

It is understandable that a size of the first filling hole 240 may be the same as or different from a size of the second filling hole 250. The size of the first filling hole 240 refers to a hole diameter of the first filling hole 240, and the size of the second filling hole 250 refers to a hole diameter of the second filling hole 250, that is, the size in the X direction as shown in FIG. 6.

It is to be noted that after the step of forming a dielectric layer on the substrate and etching the dielectric layer to form a first filling hole exposing the word line, the method for manufacturing a memory further includes: forming a barrier layer on a hole wall of the second filling hole, in which the barrier layer located in the second filling hole surrounds and forms a second intermediate hole exposing the substrate.

Referring to FIG. 7 and FIG. 8, the barrier layer 300 is formed on the hole wall of the second filling hole 250, so as to protect the hole wall of the second filling hole 250 and prevent the hole wall of the second filling hole 250 from being damaged in subsequent etching. The barrier layer 300 located in the second filling hole 250 surrounds and forms a second intermediate hole 320, and the barrier layer 300 may be a titanium nitride layer. The step of forming the barrier layer 300 on the hole wall of the second filling hole 250 can refer to the step of forming the barrier layer 300 on the hole wall of the first filling hole 240, which is not be repeated here.

In a possible example, a barrier layer 300 may be formed on the hole wall of the first filling hole 240 and the hole wall of the second filling hole 250 simultaneously, which specifically includes the following process. A barrier layer is formed on the hole wall and a hole bottom of the first filling hole, the hole wall and a hole bottom of the second filling hole, and the dielectric layer; and the barrier layer located on the dielectric layer, on the hole bottom of the first intermediate hole, and on the hole bottom of the second intermediate hole is removed.

As shown in FIG. 7, the barrier layer 300 is formed by deposition on the hole wall and hole bottom of the first filling hole 240, on the hole wall and the hole bottom of the second filling hole 250, and on the dielectric layer 200. The barrier layer 300 located in the first filling hole 240 forms the first intermediate hole 310, and the barrier layer 300 located in the second filling hole 250 forms the second intermediate hole 320.

As shown in FIG. 8, the barrier layer 300 located on the dielectric layer 200, on the hole bottom of the first intermediate hole 310, and on the hole bottom of the second intermediate hole 320 is etched. After parts of the barrier layer 300 are removed, the surface of the dielectric layer 200 away from the substrate 100, the word line 110, the first residue 120 on the word line 110, a part of the substrate 100, and the second residue 130 on the substrate 100 are exposed. Exemplarily, by controlling the directionality of plasma, the barrier layer 300 is etched in a desired direction.

It is to be noted that after the step of forming a barrier layer on a hole wall of the second filling hole, in which the barrier layer located in the second filling hole surrounds and forms a second intermediate hole exposing the substrate, the method for manufacturing a memory in the embodiments of the present disclosure further includes: etching the substrate exposed in the second intermediate hole to remove the second residue on the substrate; and forming in the second intermediate hole a second wire electrically connected to the substrate.

The step of etching the substrate exposed in the second intermediate hole to remove the second residue on the substrate includes: removing the second residue on the substrate by means of plasma etching to generate a second reactant; and then removing the second reactant by means of wet etching.

Exemplarily, the material of the substrate 100 is silicon, the second residue 130 is a silicon oxide, and a second etching gas used in the plasma etching is a mixture of ozone (O3) and diluted hydrofluoric acid (DHF). The reaction formula for the plasma etching of the second residue 130 is:

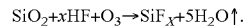

$$SiO_2+xHF+O_3\rightarrow SiF_x+5H_2O\uparrow.$$

After the second residue 130 is etched using the second etching gas, the second residue 130 generates a second reactant, and then the generated second reactant is removed by means of wet etching, thereby removing the second residue 130 on the substrate 100 to form a relatively smooth surface of the substrate 100.

It is understandable that in the process of removing the second residue 130 on the substrate 100, a fewer barrier layer 300 is removed, and thus the hole wall of the second filling hole 250 can be protected to allow the second residue 130 to be fully reacted. Thus, the removal effect of the second residue 130 is improved, and the second residue 130 is less or not left.

It is to be noted that the first reactant and the second reactant can be removed in the same wet etching process, that is, while the second reactant is removed by means of wet etching, the first reactant is also removed by means of wet etching. For example, an etching solution for the wet etching may be a solution prepared by mixing water and hydrofluoric acid in a ratio of 200:1.

Figure 12:
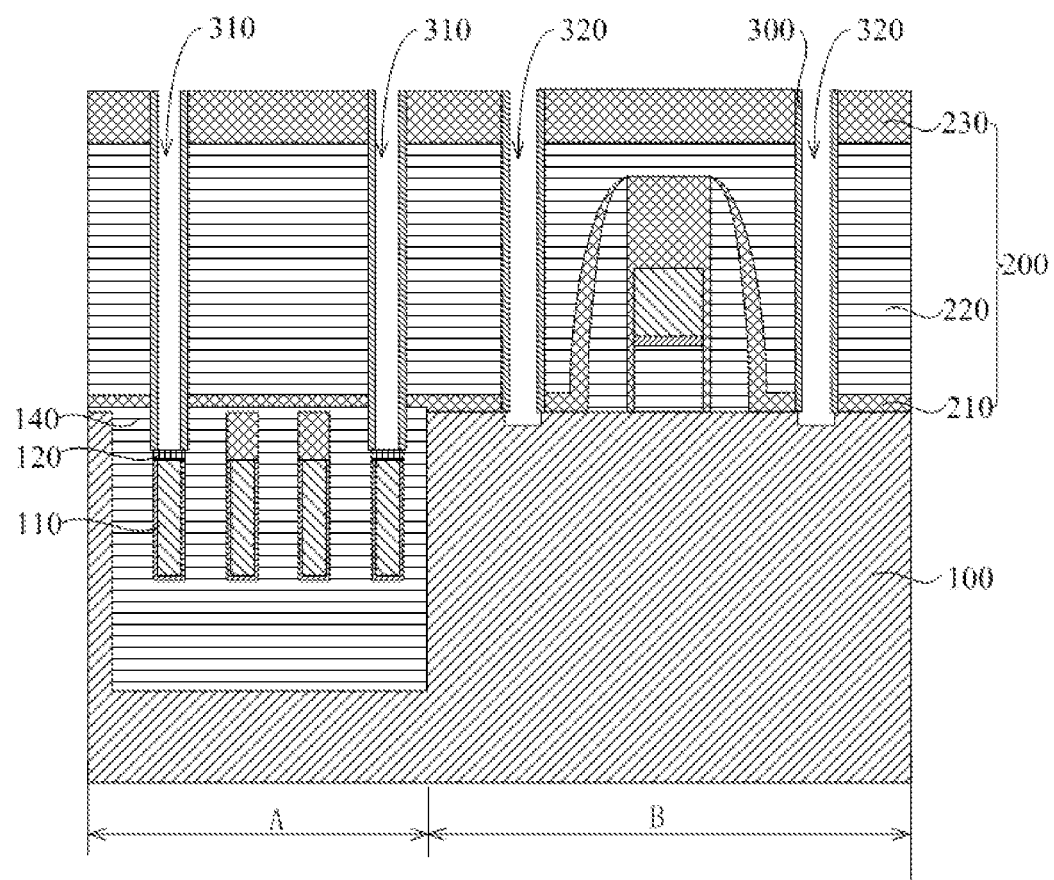
FIG. 12 is a schematic structural diagram after removing a second residue according to an embodiment of the present disclosure.

In a possible example, referring to FIG. 9 and FIG. 12, the substrate 100 exposed in the second intermediate hole 320 may be etched first to remove the second residue 130 on the substrate 100, as shown in FIG. 12. Then, the word line 110 exposed in the first intermediate hole 310 is etched to remove the first residue 120 on the word line 110, as shown in FIG. 9.

In this way, in the process of removing the first residue 120 by using the mixture of hydrogen and argon, the semiconductor structure is located in the hydrogen and argon. That is, the second intermediate hole 320 is filled with hydrogen and argon to protect the substrate 100 and prevent the substrate 100 from being oxidized again.

While the second wire 500 is formed in the second intermediate hole 320, the first wire 400 is formed in the first intermediate hole 310, that is, the first wire 400 and the second wire 500 are formed simultaneously. Exemplarily, a conductive material is deposited in each of the first intermediate hole 310 and the second intermediate hole 320 to form the first wire 400 in the first intermediate hole 310 and the second wire 500 in the second intermediate hole 320.

Referring to FIG. 10 and FIG. 11, the first wire 400 is electrically connected to the word line 110, and the second wire 500 is electrically connected to the substrate 100. The first wire 400 and the second wire 500 may also be electrically connected to each other. As shown in FIG. 10, a conductive material is deposited in the first intermediate hole 310, in the second intermediate hole 320, and on the dielectric layer 200 to form a second conductive layer 700.

It is understandable that the second conductive layer 700 covers the upper surface of the dielectric layer 200. The second conductive layer 700 located in the first intermediate hole 310 is the first wire 400, the second conductive layer 700 located in the second intermediate hole 320 is the second wire 500, and the first wire 400 and the second wire 500 are electrically connected by means of the second conductive layer 700 located on the dielectric layer 200.

Figure 13:
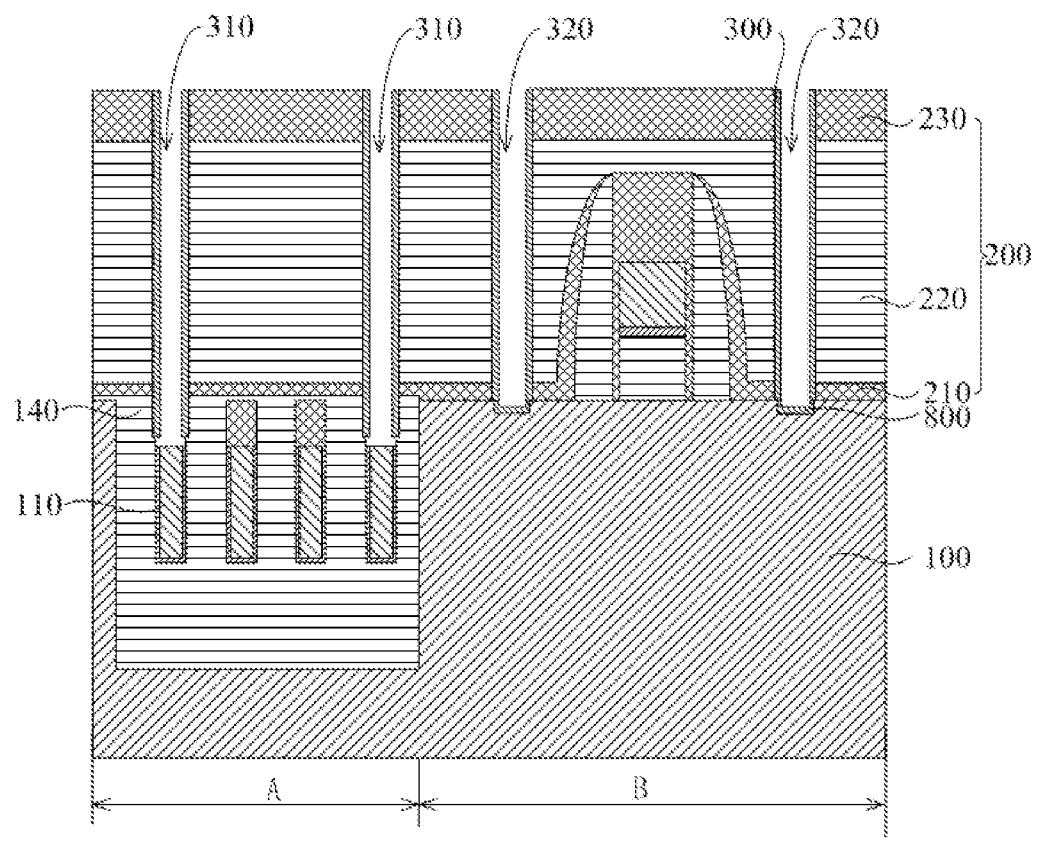
FIG. 13 is a schematic structural diagram after forming a second wire according to an embodiment of the present disclosure.

In a possible example, referring to FIG. 13, before the step of forming in the second intermediate hole a second wire electrically connected to the substrate, the method for manufacturing a memory further includes: forming a metal complex in the second intermediate hole. As shown in FIG. 13, a metal complex 800 is formed on the hole bottom of the second intermediate hole 320. Exemplarily, a silicon-cobalt complex (CoSix) is formed on the hole bottom of the second intermediate hole 320 by means of high-temperature compounding.

Referring to FIG. 10 and FIG. 11, the embodiments of the present disclosure further provide a memory. The memory includes: a substrate 100, a dielectric layer 200 provided on the substrate 100, and a first wire 400 and a second wire 500 provided in the dielectric layer 200.

The substrate 100 includes a core region and a peripheral region. The core region abuts the peripheral region. The core region is located at a portion A shown in FIG. 10, and the peripheral region is located at a portion B shown in FIG. 10. A capacitor is subsequently formed above the core region of the substrate 100, and a peripheral circuit is subsequently formed above the peripheral region of the substrate 100.

A word line 110 is provided in the core region of the substrate 100, for example, the word line 110 may be a buried word line. Referring to FIG. 10, the word line 110 may include a first conductive layer and an anti-diffusion layer provided on a side wall and a bottom wall of the first conductive layer. Exemplarily, the material of the first conductive layer is tungsten, and the material of the anti-diffusion layer is titanium nitride. There may be multiple word lines 110, and the multiple word lines 110 are arranged at intervals. For example, an isolation structure 140 is provided between the word lines 110 so as to electrically isolate the word lines 110.

The dielectric layer 200 is provided on the substrate 100. The dielectric layer 200 is provided with a first filling hole 240 and a second filling hole 250 that run through this layer. The first filling hole 240 is located in the core region and extends to the word line 110, and the second filling hole 250 is located in the peripheral region and extends to the substrate 100. It is understandable that, the first filling hole 240 exposes the word line 110, and the second filling hole 250 exposes the substrate 100.

A size of the first filling hole 240 may be the same as or different from a size of the second filling hole 250. The size of the first filling hole 240 refers to a hole diameter of the first filling hole 240, and the size of the second filling hole 250 refers to a hole diameter of the second filling hole 250.

A hole wall of the first filling hole 240 and a hole wall of the second filling hole 250 are provided with a barrier layer 300, and the material of the barrier layer 300 may be silicon nitride. The barrier layer 300 located in the first filling hole 240 surrounds and forms a first intermediate hole 310, and the first intermediate hole 310 exposes the word line 110. The barrier layer 300 located in the second filling hole 250 surrounds and forms a second intermediate hole 320, and the second intermediate hole 320 exposes the substrate 100.

A first wire 400 is filled in the first intermediate hole 310 and is electrically connected to the word line 110, and a second wire 500 is filled in the second intermediate hole 320 and is electrically connected to the substrate 100. The material of the first wire 400 and the material of the second wire 500 may be tungsten, cobalt, or the like.

In a possible example, a second conductive layer 700 is provided in the first intermediate hole 310, in the second intermediate hole 320, and on the dielectric layer 200. As shown in FIG. 10, the second conductive layer 700 covers the dielectric layer 200, and a surface of the second conductive layer 700 away from the substrate 100 is a flush surface. The second conductive layer 700 located in the first intermediate hole 310 is the first wire 400, the second conductive layer 700 located in the second intermediate hole 320 is the second wire 500, and the first wire 400 and the second wire 500 are electrically connected by means of the second conductive layer 700 located on the dielectric layer 200.

The memory provided in the embodiments of the present disclosure includes a substrate 100 and a dielectric layer 200 provided on the substrate 100. The substrate 100 includes a core region and a peripheral region. A word line 110 is provided in the core region. The dielectric layer 200 is provided with a first filling hole 240 and a second filling hole 250 that run through the dielectric layer 200. The first filling hole 240 is located in the core region and extends to the word line 110 so that the word line 110 is exposed in the first filling hole 240. The second filling hole 250 is located in the peripheral region and extends to the substrate 100 so that the substrate 100 is exposed in the second filling hole 250. A barrier layer 300 is provided on a hole wall of the first filling hole 240 and a hole wall of the second filling hole 250. The barrier layer 300 located in the first filling hole 240 surrounds and forms a first intermediate hole 310, the first intermediate hole 310 is filled with a first wire 400, and the first wire 400 is electrically connected to the word line 110. The barrier layer 300 located in the second filling hole 250 surrounds and forms a second intermediate hole 320, the second intermediate hole 320 is filled with a second wire 500, and the second wire 500 is electrically connected to the substrate 100. By providing, on the hole wall of the first filling hole 240 and the hole wall of the second filling hole 250, the barrier layer 300 which protects the hole wall of the first filling hole 240 and the hole wall of the second filling hole 250, when the word line 110 in the first intermediate hole 310 and the substrate 100 in the second intermediate hole 320 are cleaned, the reaction can be adequately carried out so that the surfaces of the word line 110 in the first intermediate hole 310 and of the substrate 100 in the second intermediate hole 320 are smooth and free of foreign matter, thereby reducing the resistances between the first wire 400 and the word line 110 and between the second wire 500 and the substrate 100, and improving the storage speed and storage efficiency of the memory. In addition, the barrier layer 300 can also reduce or even prevent the bending of the hole wall of the first filling hole 240 and the bending of the hole wall of the second filling hole 250, so that fewer voids 600 are subsequently formed inside the first wire 400 and the second wire 500, thus the charge transfer capability of the first wire 400 and the second wire 500 is improved, and the storage speed and storage efficiency of the memory are further improved.

The embodiments and implementations in this specification are described in a progressive manner. Each embodiment illustrates in emphasis the differences from other embodiments. The same or similar parts in the embodiments can refer to each other.

In the descriptions of this specification, the description of a reference term such as "an embodiment", "some embodiments", "schematic embodiment", "example", "specific example", or "some examples" means that a specific feature, structure, material, or characteristic that is described with reference to the embodiment or the example is included in at least one embodiment or example of the present disclosure. In this specification, exemplary descriptions of the foregoing terms do not necessarily refer to the same embodiment or example. In addition, the described specific features, structures, materials, or characteristics may be combined in a proper manner in any one or more of the embodiments or examples.

Finally, it should be noted that the foregoing embodiments are merely used for describing the technical solutions of the present disclosure, rather than limiting the present disclosure. Although the present disclosure is described in detail with reference to the foregoing embodiments, persons of ordinary skill in the art should understand that they can still make modifications to the technical solutions described in the foregoing embodiments or make equivalent replacements on some or all of technical features therein. These modifications or replacements do not cause the essence of the corresponding technical solutions to depart from the scope of the technical solutions of the embodiments of the present disclosure.

What is claimed is:

1. A method for manufacturing a memory, comprising:
   providing a substrate having a core region and a peripheral region, wherein the core region is provided with a word line;
   forming a dielectric layer on the substrate, and etching the dielectric layer to form a first filling hole and a second filling hole, the first filling hole exposing the word line, and the second filling hole exposing the substrate of the peripheral region;
   forming a barrier layer on a hole wall of the first filling hole and a hole wall of the second filling hole, wherein the barrier layer located in the first filling hole surrounds and forms a first intermediate hole exposing the word line, the barrier layer located in the second filling hole surrounds and forms a second intermediate hole exposing the substrate;
   etching the word line exposed in the first intermediate hole to remove a first residue on the word line, etching the substrate exposed in the second intermediate hole to remove a second residue on the substrate;
   forming in the first intermediate hole a first wire electrically connected to the word line;
   forming a metal complex in the second intermediate hole; and
   forming in the second intermediate hole a second wire electrically connected to the substrate.

2. The method for manufacturing a memory of claim 1, wherein
   the step of forming a barrier layer on a hole wall of the first filling hole, wherein the barrier layer located in the first filling hole surrounds and forms a first intermediate hole exposing the word line comprises:
   forming the barrier layer on the hole wall and a hole bottom of the first filling hole and the dielectric layer, wherein the barrier layer located in the first filling hole surrounds and forms the first intermediate hole; and
   removing the barrier layer on the dielectric layer and a hole bottom of the first intermediate hole.

3. The method for manufacturing a memory of claim 1, wherein
   the step of etching the word line exposed in the first intermediate hole to remove a first residue on the word line comprises:
   removing the first residue on the word line by means of plasma etching to generate a first reactant; and
   removing the first reactant by means of wet etching.

4. The method for manufacturing a memory of claim 1, wherein
   in a horizontal direction, a size of the first filling hole is greater than a size of the word line, and the hole wall of the first filling hole has a distance difference of 1-3 nm from an edge of the word line.

5. The method for manufacturing a memory of claim 1, wherein
   the barrier layer is formed on the hole wall of the first filling hole and the hole wall of the second filling hole simultaneously.

6. The method for manufacturing a memory of claim 5, wherein
   the step that the barrier layer is formed on the hole wall of the first filling hole and the hole wall of the second filling hole simultaneously comprises:
   forming the barrier layer on the hole wall and a hole bottom of the first filling hole, on the hole wall and a hole bottom of the second filling hole, and on the dielectric layer; and
   removing the barrier layer located on the dielectric layer, on a hole bottom of the first intermediate hole, and on a hole bottom of the second intermediate hole.

7. The method for manufacturing a memory of claim 1, wherein
   the step of etching the substrate exposed in the second intermediate hole to remove a second residue on the substrate comprises:
   removing the second residue on the substrate by means of plasma etching to generate a second reactant; and
   removing the second reactant by means of wet etching.

8. The method for manufacturing a memory of claim 7, wherein a second etching gas used in the plasma etching is a mixture of ozone and diluted hydrofluoric acid; and the material of the substrate is silicon, and the second residue is silicon oxide.

9. The method for manufacturing a memory of claim 1, wherein while the first wire is formed in the first intermediate hole, the second wire is formed in the second intermediate hole.

10. A method for manufacturing a memory, comprising:

providing a substrate having a core region provided with a word line;

forming a dielectric layer on the substrate, and etching the dielectric layer to form a first filling hole exposing the word line;

forming a barrier layer on a hole wall of the first filling hole, wherein the barrier layer located in the first filling hole surrounds and forms a first intermediate hole exposing the word line;

etching the word line exposed in the first intermediate hole to remove a first residue on the word line; and forming in the first intermediate hole a first wire electrically connected to the word line;

wherein the step of etching the word line exposed in the first intermediate hole to remove a first residue on the word line comprises:

removing the first residue on the word line by means of plasma etching to generate a first reactant; and removing the first reactant by means of wet etching;

a first etching gas used in the plasma etching is a mixture of hydrogen and argon; and wherein the material of the word line is tungsten, the first residue is tungsten oxide, and the first reactant is tungsten.

11. A memory, comprising:

a substrate comprising a core region and a peripheral region, wherein a word line is provided in the core region, wherein the word line comprises a first conductive layer and an anti-diffusion layer provided on a side wall and a bottom wall of the first conductive layer;

a dielectric layer provided on the substrate, the dielectric layer being provided with a first filling hole and a second filling hole that run through the dielectric layer, the first filling hole being located in the core region and extending to the word line, and the second filling hole being located in the peripheral region and extending to the substrate;

a barrier layer provided on a hole wall of the first filling hole and a hole wall of the second filling hole, wherein the barrier layer located in the first filling hole surrounds and forms a first intermediate hole exposing the word line, and the barrier layer located in the second filling hole surrounds and forms a second intermediate hole exposing the substrate;

a first wire filled in the first intermediate hole and electrically connected to the word line; and a second wire filled in the second intermediate hole and electrically connected to the substrate.

12. The memory of claim 11, wherein the material of the substrate is silicon and the material of the word line is tungsten.

13. The memory of claim 11, wherein in a horizontal direction, a size of the first filling hole is greater than a size of the word line, and the hole wall of the first filling hole has a distance difference of 1-3 nm from an edge of the word line.

14. The memory of claim 11, wherein a size of the first filling hole is same as or different from a size of the second filling hole.

15. The memory of claim 11, a second conductive layer is provided in the first intermediate hole, in the second intermediate hole and on the dielectric layer, the second conductive layer located in the first intermediate hole being the first wire, and the second conductive layer located in the second intermediate hole being the second wire, and wherein the first wire and the second wire are electrically connected by means of the second conductive layer located on the dielectric layer.

* * * * *